United States Patent
Sandberg et al.

(10) Patent No.: US 7,265,379 B2
(45) Date of Patent: Sep. 4, 2007

(54) ORGANIC ELECTRONIC DEVICE AND METHODS FOR MANUFACTURING A DEVICE OF THIS KIND

(75) Inventors: Mats Sandberg, Rimforsa (SE); Per-Erik Nordal, Asker (NO); Grzegorz Greczynski, Linköping (SE); Mats Johansson, Linköping (SE); Per Carlsen, Hundhamaren (NO); Hans Gude Gudesen, Brussels (BE); Göran Gustafsson, Linköping (SE); Linda Andersson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 11/088,194

(22) Filed: Mar. 24, 2005

(65) Prior Publication Data

US 2005/0249975 A1    Nov. 10, 2005

(30) Foreign Application Priority Data

Mar. 26, 2004   (NO)   ................................. 20041276

(51) Int. Cl.
   H01L 29/08   (2006.01)
   H01L 35/24   (2006.01)
   H01L 51/00   (2006.01)
(52) U.S. Cl. .................. 257/40; 257/E51.027; 428/690
(58) Field of Classification Search ...................... None
   See application file for complete search history.

(56) References Cited

U.S. PATENT DOCUMENTS

| | | | |
|---|---|---|---|
| 5,705,888 A * | 1/1998 | Staring et al. | ............... 313/503 |
| 6,055,180 A * | 4/2000 | Gudesen et al. | ............ 365/175 |
| 6,284,654 B1 | 9/2001 | Roeder et al. | |
| 6,433,359 B1 | 8/2002 | Kelley et al. | |
| 6,611,096 B1 * | 8/2003 | McCormick et al. | ........ 313/506 |
| 6,670,659 B1 * | 12/2003 | Gudesen et al. | ............ 257/295 |
| 6,812,509 B2 * | 11/2004 | Xu | .............................. 257/295 |
| 6,872,969 B2 * | 3/2005 | Redecker | ...................... 257/40 |
| 6,878,961 B2 * | 4/2005 | Lyons et al. | ................... 257/40 |

(Continued)

FOREIGN PATENT DOCUMENTS

EP    0330395 A2    8/1989

(Continued)

OTHER PUBLICATIONS

J.P. Savage et al., *Comprehensive Supramolecular Chemistry*, vol. 9, (1966), pp. 507-528.

(Continued)

*Primary Examiner*—Evan Pert
*Assistant Examiner*—Benjamin P. Sandvik
(74) *Attorney, Agent, or Firm*—Birch, Stewart, Kolasch & Birch, LLP

(57) ABSTRACT

An organic electronic device consists of one or more electro-active organic or polymer materials sandwiched between electrodes. Critical in such devices is the interface between the electrode and the polymer, where degradation or chemical reaction products may develop that are deleterious to the proper functioning of the device. This is solved by introducing a functional interlayer composed of one or more materials consisting of a molecular backbone bearing phosphonate or phosphate functions, either directly attached or through side chains, said functional layer being disposed between at least one of the respective electrodes and said one or more electro-active materials in the device.

57 Claims, 6 Drawing Sheets

U.S. PATENT DOCUMENTS

Figure 1:
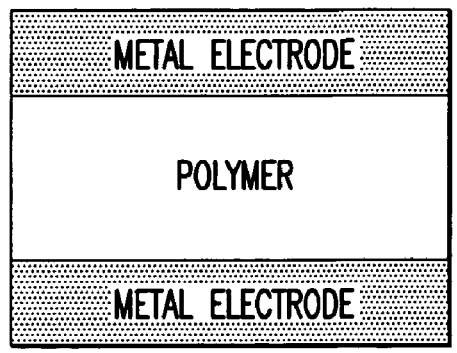

| | | |
|---|---|---|
| 6,946,676 B2 * | 9/2005 | Kelley et al. ............... 257/40 |
| 7,075,105 B2 * | 7/2006 | Kano ........................ 257/40 |
| 2002/0014617 A1 * | 2/2002 | Angelopoulos et al. ..... 252/500 |
| 2003/0008135 A1 * | 1/2003 | Kawamura et al. ......... 428/336 |
| 2003/0056078 A1 * | 3/2003 | Johansson et al. .......... 711/200 |

FOREIGN PATENT DOCUMENTS

| | | |
|---|---|---|
| EP | 0549345 A2 | 6/1993 |
| NO | 2002/5644 A | 4/2002 |
| WO | WO-03/041185 A2 | 5/2003 |
| WO | WO-03/044801 A1 | 5/2003 |
| WO | WO-03/074596 A1 | 9/2003 |
| WO | WO-03/075389 | 9/2003 |

OTHER PUBLICATIONS

Guang Cao et al., *Inorg. Chem.*, vol. 27, (1988), pp. 2781-2785.

Yiping Zhang et al., *Inorg. Chem.*, vol. 31, (1992), pp. 2821-2826.

* cited by examiner

POLY(VINYLPHOSPHONIC ACID)
(PVPA)

POLY(VINYLPHOSPHONIC ACID-CO-ACRYLIC ACID) 70:30
(CoP-R)

EXAMPLE OF CROSS-LINKING MECHANISM FOR A COPOLYMER CONTAINING
PHOSPHONIC ACID-AND CRYLIC ACID GROUPS

ORGANIC ELECTRONIC DEVICE AND METHODS FOR MANUFACTURING A DEVICE OF THIS KIND

The present invention concerns an organic electronic device comprising electro-active organic materials capable of responding physically or chemically when subjected to electric fields or currents, wherein the electro-active materials are provided in a layered structure between a first set and a second set or respective electrodes, wherein a cell with a capacitor-like structure is defined in the electro-active materials and can be accessed electrically directly or indirectly via the electrodes, and wherein each cell can be addressed selectively for evoking an electro-active response.

The present invention also concerns methods for manufacturing a device of this kind.

Particularly the present invention concerns certain organic-based materials that exhibit beneficial electrical and chemical properties when used in conjunction with objects and devices where management of electrical charges is required. More specifically, the present invention concerns the use of such organic-based materials in thin film electronic devices containing electro-active organic materials capable of responding physically or chemically when subjected to electric fields or currents, and in particular memory devices where the devices comprise organic memory materials exhibiting electret or ferroelectric properties. The memory materials are typically provided in a layered structure between a first set and a second set of respective electrodes, whereby a cell with a capacitor-like structure is defined. The cell can be accessed electrically directly or indirectly via the electrodes and is typically part of an array or matrix of similar cells where each cell can be addressed selectively for performing write, read or erase operations in the selected cell. The electrodes are typically made from one of a range of metals or alloys which in some cases are surface modified to form oxide films, etc. Electrodes made from conducting organic materials, e.g. conjugated polymers, are also possible.

A common problem in devices where electrodes contact organic materials is that chemical and/or physical processes take place at the electrode interfaces, either during the manufacturing of the device or as a result of electrical stresses (current or voltage) during operation of the device. These processes may lead to undesired effects, ranging from diminished performance to catastrophic failure.

One class of remedies that has received attention is to provide an organic or inorganic interlayer between the electrode and the polymer films. The interlayer shall have a range of functions, and in order to emphasize this aspect such interlayers shall henceforth be termed "functional interlayers" in the present document. Thus, an interlayer shall for example serve as a barrier such that deleterious chemical reactions are avoided between the electrodes and the electro-active organic materials, either by representing an inert and impenetrable barrier or by reacting in a controlled manner with the contiguous materials. Another function of the interlayer may be to provide protection towards physical damage that can occur during for example metal deposition by sputtering.

Examples of reported inserted interlayers are oxides of various metals, such as TiOx, or nitrides, e.g. TiN, typically representing a stochiometric dense interface region. Inorganic interlayer materials are of relevance with inorganic as well as organic electro-active substances.

It is important to recognize that essentially all types of devices that are of relevance in the present context place very specific requirements on the electrical properties of such interlayers, in addition to their degree of permeability, chemical reactivity, cost, toxicity, processability etc. In particular, memory cells in capacitor-like structures are vulnerable to build-up at the electrodes of "dead" layers, e.g. chemical reaction products, that are electrically insulating and have a low dielectric constant. Each "dead" layer represents a low capacitance in series with the memory cell, leading to a reduced proportion of the applied cell voltage being brought to bear on the memory substance in the cell, resulting in poorer performance.

The issue of interlayer electrical properties in conjunction with thin film electronic devices for memory and display applications where the devices comprise electro-active organic or polymeric materials, is discussed in a co-pending patent application by the present applicant. One attribute which may be provided in a purpose-built functional interlayer is low electrical resistance or large capacitance in the frequency regions of interest, which effectively extends the electrode into and through the interlayer.

Functional interlayers based on organic materials, in particular oligomers and polymers, are of particular interest in connection with devices employing electro-active organic materials such as e.g. ferroelectric polymers and oligomers. Functional interlayer materials may be grouped as high dielectric constant insulators or conductors with low complex impedance at the relevant frequencies. In the latter category, one may define sub-categories of materials with high electronic conductivity or materials with high proton conduction. Examples of the first are doped polypyrrole (PPY), polyaniline (PANI), polythiophenes or other heterocyclic polymeric materials, while examples in the other category comprise for example polyethylenedioxythiophene (PEDOT), e.g. doped with polystyrenesulphonic acid (PSSH), and derivatives of the same.

Organic-based functional interlayers have so far proven difficult to implement in practical memory devices. In addition to difficulties in maintaining chemical integrity and barrier properties when subjected to electrical stresses during operation, there has in particular been a major problem of attaining and maintaining satisfactory electrical properties, i.e. low complex impedance in the interlayer at the relevant frequencies: On the one hand, electron conductors are easily damaged during top electrode deposition, in processes resembling de-doping. Hydrous proton conductors on the other hand typically rely on water to maintain their conductivity and/or high capacitance, which makes them exposed to dehydration at higher temperatures. This dehydration, which may become significant at temperatures well below 80-100 C, causes the conductivity and/or capacitance of the functional layer to drop dramatically. The loss of conductivity and/or capacitance in the interlayer destroys the intended function of the functional interlayers, which themselves become "dead layers".

In view of the above considerations it is a major object of the present invention to describe particular classes of materials suitable for incorporation as functional interlayers in thin film electronic devices containing electro-active organic materials, in particular memory devices containing electret or ferroelectric organic materials. These interlayers must maintain a high conductivity and/or dielectric constant throughout the lifetime of the devices, even after prolonged periods of storage or operation in a dry ambient and/or at high temperatures.

It is another object to provide teachings on procedures and processing details that are important success factors in the manufacture of memory devices incorporating functional interlayers according to the present invention.

The above-mentioned objects as well as further features and advantages are realized according to the present invention with an organic/electronic device which is in further comprising at least one functional interlayer composed of one or more materials comprising molecular moieties to phosphonic or phosphoric acid groups or salts of the same, wherein one functional interlayer in any case is provided between at least one of the electrodes and the interfacing electroactive organic materials, and wherein in case more than one interlayer is provided, said interlayers can have similar or different compositions.

In a first preferred embodiment the organic electronic device is a non-volatile memory device, the electro-active material is an electrically polarizable dielectric memory material with ferroelectric or electret properties and capable of exhibiting hysteresis or remanence, and memory cells in the non-volatile memory device form the elements of an active or passive matrix, such that the evoked electro-active response constitutes a write/read/erase operation establishing a desired polarization state in a memory cell or performing a polarization switching thereof, whereby a definite polarization state established in the memory cell defines a logical state thereof.

In a second preferred embodiment the organic electronic device is a light-emitting device, and the electro-active material is a light-emitting material, such that the evoked electro-active response constitutes an emission of light when stimulated by an electric field or current.

In a third preferred embodiment organic electronic device is a capacitor, and the functional interlayer itself constitutes the electro-active material.

The above-mentioned objects as well as further features and advantages are also realized according to the present invention with a method for manufacturing the organic electronic device whereby a first method is characterized by depositing the functional interlayer material by one of the following processes: spin coating, evaporation, sputtering, chemical vapour deposition (CVD), physical vapour deposition, self-assembly or alternating layer-by-layer (LBL) deposition of oppositely charged polyelectrolytes, or LBL structures built by metal phosphonate chemistry; another method is characterized by stabilizing and/or insolubilizing at least one of the functional interlayer materials; and finally yet another method is characterized by patterning at least one of the functional interlayers; said methods being performed either separately or in combination.

Further features and advantages shall be apparent from the appended dependent claims.

The invention shall now be described in detail, with reference to the drawing figures, whereof FIG. 1 shows a generic capacitor-like structure of relevance to the present invention, FIG. 2 an analogous structure to that in FIG. 1, after the formation of a "dead layer" at each electrode/memory material interface, FIG. 3 an analogous structure to that in FIG. 1, but now with a functional layer according to the present invention inserted between each electrode and the memory layer, FIG. 4*a* the thermal stability of the dielectric constant of a poly(vinylphosphonic acid) (PVPA) based functional interlayer compared to another type of organic interlayer, FIG. 4*b* the eye opening (difference between the pulse response for a logical one and a zero) after 16 hours at 70 C for a device containing a PVPA based functional interlayer compared to a device with another type of organic interlayer, FIGS. 5*a*, 5*b*, and 5*c* examples of polymers according to the present invention, FIG. 6 a cross section of a device representing a preferred embodiment according to the present invention, and FIG. 7 important steps in the manufacturing of a passive matrix-addressable device according to a preferred embodiment of the present invention.

The basic ideas and features behind the present invention can be illustrated and discussed by referring first to the generic device structure illustrated in FIG. 1. For concreteness, the structure may represent, e.g. an elementary memory cell in a data storage device according to prior art. The electro-active material, in this case a ferroelectric or electret organic material which exhibits polarization remanence and thus can act as memory substance, is sandwiched between two electrodes in a capacitor-like structure. By applying a voltage signal between the electrodes, the memory material is subjected to electrical fields that may affect or interrogate its polarization state. In practical devices, a large number of cells are manufactured side by side in arrays on a common solid substrate. Typically, the cells are built sequentially, starting with the electrode closest to the substrate (termed "bottom electrode" in the present document), and eventually reaching the step where the opposite electrode is deposited on top of the sandwich structure to form what shall subsequently be termed the "top electrode".

Figure 2:
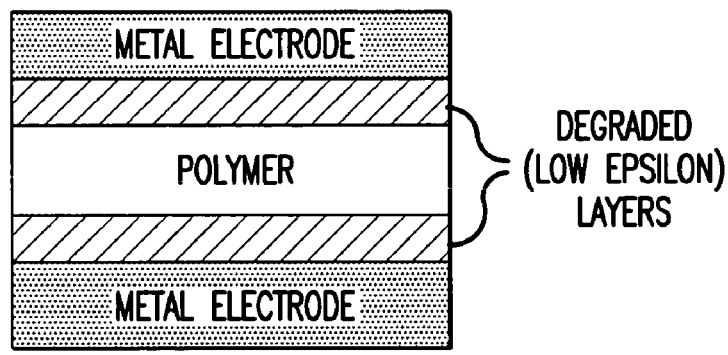

FIG. 2 shows the cell in FIG. 1 after having been subjected to chemical and/or electrical stresses of the kind which is commonly encountered during manufacture and extended periods of operation: In the interface regions where the electrodes contact the electro-active material in the cell there have formed "dead layers" which lack the properties of either the electrodes or the electro-active material, and generally reduce the performance of the cell. Typically, the dead layers are chemical reaction products of low conductivity and dielectric constant ("low epsilon"), causing the dead layers to appear as parasitic capacitances in series with the cell.

Figure 3:
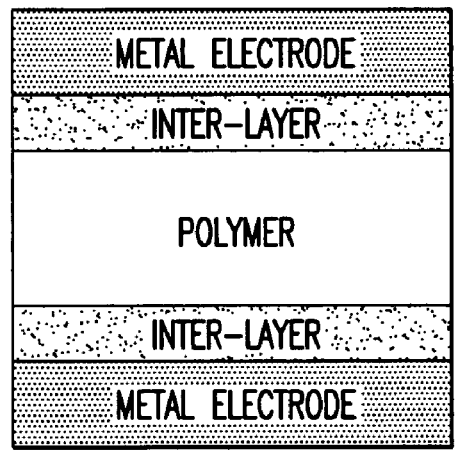

FIG. 3 shows a cell similar to that shown in FIG. 1, but now according to the present invention, where functional interlayers have been created between the electrodes and the electro-active material. This is typically achieved through a dedicated deposition step during the cell manufacturing process, but may also be supplemented by post-deposition controlled reactions. Whereas the basic idea illustrated in FIG. 3 is not new, the present invention teaches the use of particular classes of materials in the interlayers, as shall be described in detail below.

Figure 4A:
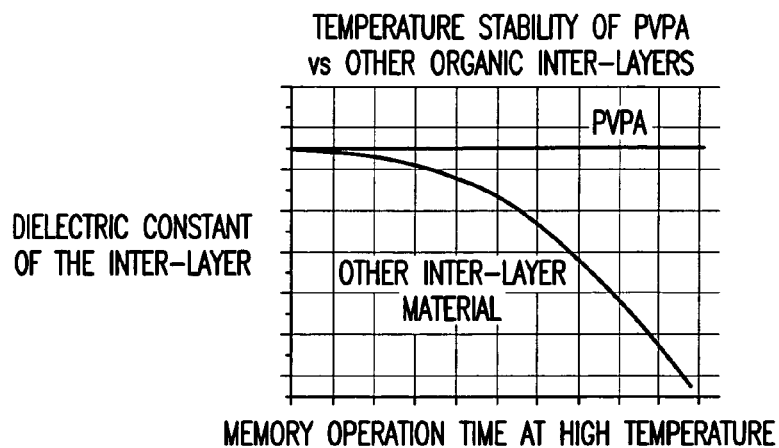
Figures 1, 4B:
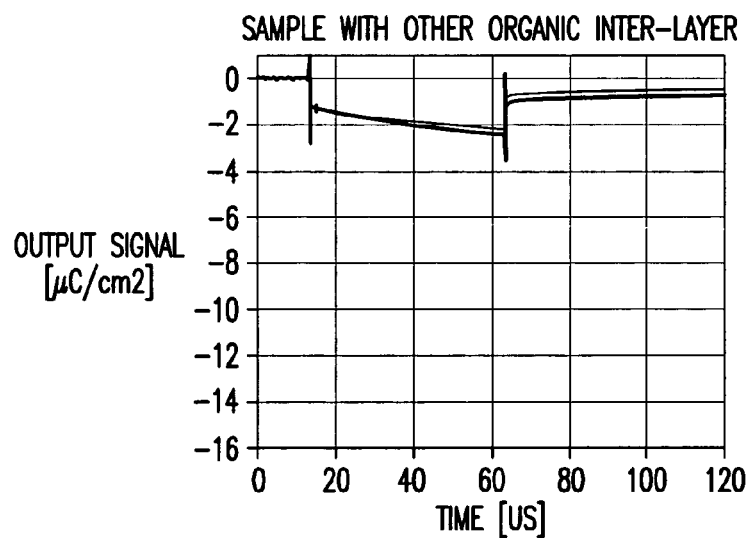
Figures 2, 4B:
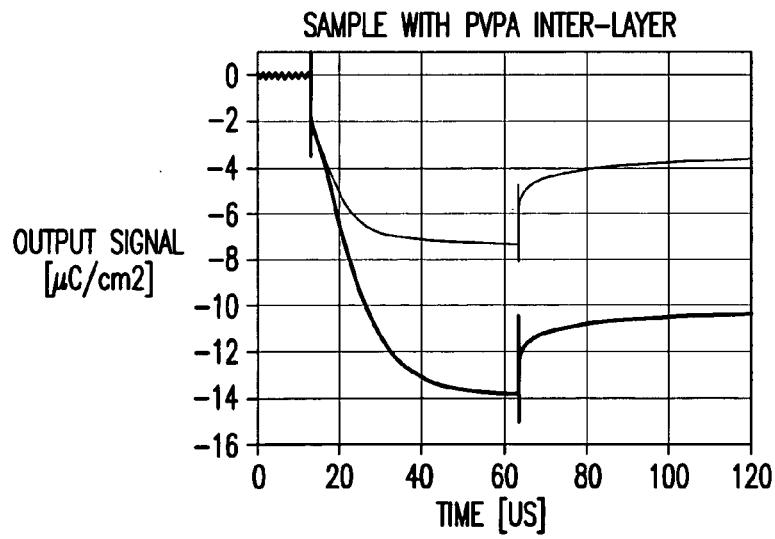
Figure 5A:
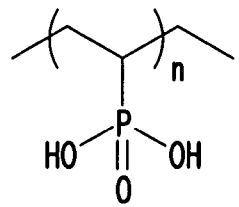
Figure 5B:
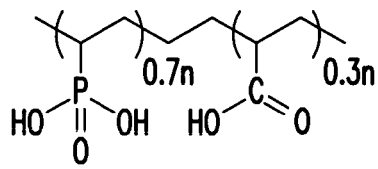
Figure 5C:
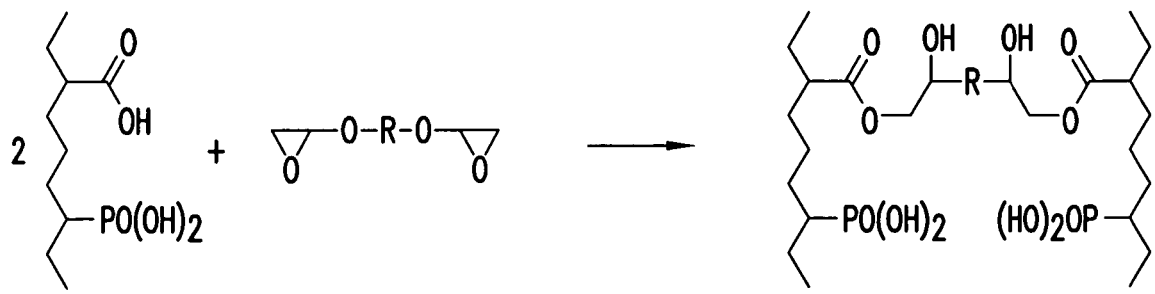

The improvement in device performance that can be achieved by employing a functional interlayer is exemplified in FIG. 4, which shows results obtained in memory cells based on ferroelectric copolymers of relevance for device fabrication, where cell degradation as a result of extended operation at high temperature is linked to a lowering of the dielectric constant in interlayers at the electrodes (FIG. 4*a*). As shown in FIG. 4*b*, the use of a functional interlayer based on a polymeric phosphonic acid according to the present invention (poly(vinylphosphonic acid) (PVPA)) provided superior performance compared to otherwise identical cells containing other organic interlayers that were tested as relevant candidate materials: In this example, the memory material in the cells was polarized corresponding to logic states "0" or "1". As can be seen, the current response to interrogating voltage pulses show a good contrast ("eye opening") between "0" and "1" states in cells with PVPA that had been subjected to 70 C during 16 hours, whereas the comparison cells had lost eye opening after the same treatment.

The present invention shall now be described in more detail. First, the basic classes of materials that constitute the functional interlayers according to the present invention shall be defined, followed by descriptions of how these interlayers can be created as thin films in the capacitor-like structures of interest. Procedures and material modifications that promote strength, temperature tolerance and interlayer adhesion of the functional interlayers are described, and a number of preferred embodiments are presented.

The group of materials that form the basis for the present invention consist of organic molecules bearing phosphonic- or phosphoric acid groups. The molecules are typically polymeric materials that are suitable for solution based processing, or smaller molecules suitable for deposition from vapor phase.

The phosphonic- or phosphoric acid materials may be homopolymers, copolymers, polymer blends or salts of the same, and the phosphonic- or phosphoric acid groups may be either directly attached to the molecular backbone, or through suitable side chains. The polymers can be obtained by step-wise as well as by chain polymerization, The latter type is preferred as they can have a high density of phosphonic or phosphoric acid groups. Further, properties of polymeric interlayer compositions can be improved by introducing additives.

When provided as thin interlayers in capacitor-like structures and subjected to various stresses that may be encountered under operative conditions for relevant devices such as memory cells shown in FIG. 3, it has been found that many materials of this generic description provide superior device performance compared to previously known alternatives. This may in part be explained by multiple functions of the materials in question.

In this context, it should be mentioned that poly(vinylphosphonic acid) (PVPA), has been reported to exhibit a high proton conductivity even at high temperature and low humidity, making it suitable for use in polymer electrolyte membranes (WO03075389).

Thus, it is reasonable to expect that the phosphonic acid or phosphoric acid groups partake in endowing the functional interlayer with observed low electrical impedance, even in dry environments and at high temperatures (e.g. 80 C). This is one of the desired attributes of such layers, as referred in the introduction above.

Many of the functional interlayer materials according to the present invention combine high dielectric constant, and thus low interlayer capacitance, with high ohmic resistance. This can be used to advantage in situations involving ultrathin electroactive layers, to eliminate danger of electrical shorts or leakage paths through defects or holes in the electroactive layer.

When applying the top electrode to a cell as shown in FIG. 1, there is a danger of damaging the electro-active material. Functional interlayers according to the present invention have been shown to provide protection against such damage, allowing more latitude in the selection of electrode deposition and patterning processes and -materials.

The backbone molecular moiety can stabilize the functional interlayer by providing an anchor for the phosphonic or phosphoric acid groups and by interacting in a predictable and controlled way with the contiguous interlayers, both the electro-active materials and the electrode surfaces. Depending on the selection of materials that are sandwiched together in a given structure, this can provide enhanced chemical stability and adhesion in the interlayer regions, as shall be referred in more detail below. Finally, the molecular moiety provides opportunities for tailoring a range of properties into the functional interlayers. An example of this is the possibility to influence the temperature behavior of the devices in question.

Interlayer compositions shall now be discussed in more detail.

Functional interlayers can be homopolymers and copolymers bearing phosphonic- or phosphoric acid groups together with other functional groupd or blends of these.

Generic examples of these classes of materials are shown in the structures below.

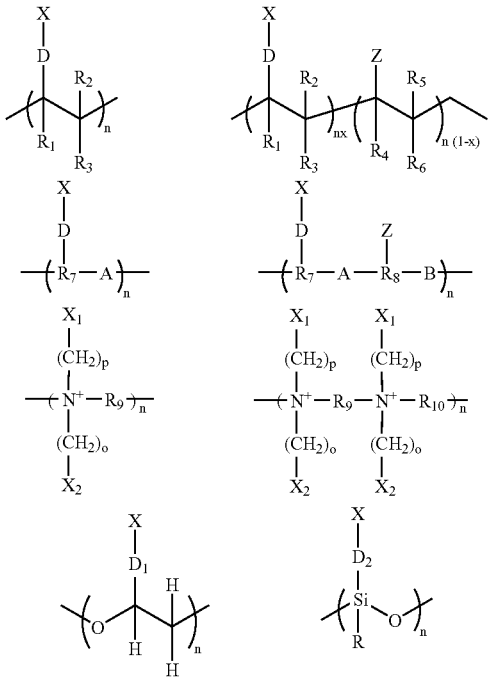

$X=PO_3H_2$ or $PO_4H_2$,
$X1=PO_3H_2$, $PO_4H_2$, H or alkyl
$X2=PO3H^-$ or $PO4H^-$
$Z=PO_3H_2$, $PO_4H_2$, $PO_3HR$, COOH, COOR, OR, CONHR, $CONR_2$,
$D=(CH_2)_p$, $O(CH_2)_p$, $COO(CH2)_p$, $CO(OCH_2CH_2)_p$, CONH, $S(CH_2)_p$, $N(CH_2)_p$, Ar, O—Ar, $CH_2Ar$, $(CH_2)_p CHY$, $(CH_2)_p Y(CH_2)_o$
$D=(CH_2)_p$, COO, $COO(CH2)_p$, $CO(OCH_2CH_2)_p$, CONH, O, S, N, Ar, O—Ar, $CH_2Ar$, $(CH_2)_p CHY$, $(CH_2)_p Y(CH_2)_o$
$D1=(CH_2)p$
$D2=(CH_2)p$, $(CH_2)pS(CH_2)_2$, $(CH_2)pS(CH_2)_3$
$Y$=alkyl or $PO_3H_2$, COOH
$R1$=H, alkyl, $PO_3H_2$, $PO_4H_2$, $PO_3HR$, COOH, COOR, OR, CONHR, $CONR_2$, $CONH_2$,
$R2=R3$=H, alkyl, $PO_3H_2$, $PO_4H_2$, $CONH_2$
$R4$=H, COOH, COOR
$R5$=H, COOH
$R6$=H
$R7$=alkyl or aromatic group
$R8$=alkyl or aromatic group
$R9$=alkyl or aromatic group
$R10$=alkyl or aromatic group
$R$=alkyl A=COO, CONH, NHCONH, NHCOO, O, CO
B=OCO, NHCO, OCONH, NHCONH, O, CO
n=large number, indicating repeating units in a polymer or oligomer
0<x<1
o=0,1,2,3 ...
p=0,1,2,3 ...

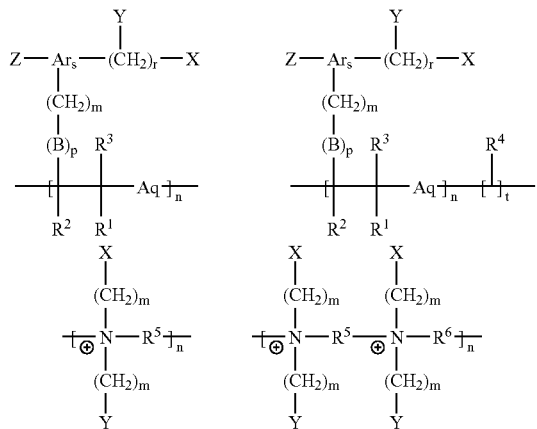

$X = -PO_3H_2$ or $-O-PO_3H_2$
y=H, alkyl or $-PO_3H_2$ or $-O-PO_3H_2$
Z=H, alkyl or $-PO_3H_2$ or $-O-PO_3H_2$
A=alkyl, Ar, —O—, —S—, —NR—, —CO—, —COO—, —CONR—, —NRCOO—, —NRCONR—
B=—CH$_2$—, —O—, —S—, —NR—, —CO—O—, —CO—NR—
$R^1$, $R^2$, $R^3$, $R^4$=H, alkyl, Ar, $-PO_3H_2$, $-OPO_3H_2$, —COOR, —CONR$_2$, —COR, —OR,
$R^5$, $R^6$=alkyl, aromatic or heteroaromatic group
Ar=aromatic or heteroaromatic group
R=H or alkyl
m=0,1,2,3
n=1,2,3,4
p=0,1
q=0,1
r=0,1,2,3
s=0,1
t=0,1,2

Examples of homopolymers include polymers made from monomers bearing one or more phosphonic or phosphoric acid groups and monomers bearing phosphonic acids and another functional group. As for polymeric phosphoric acids, one can use phosphoric esters of polymeric alcohols. Examples are: Poly(vinyl phosphoric acid), poly(isopropenylphosphonic acid), and other poly(alkenylphosphonic acids), poly(allyl phosphonic acid). Further examples are: polyacrylates, polyacrylamides, polyglycidyl ethers—or esters, or poly(styrenes) bearing phosphonic or phosphoric acid groups, poly(1,1-vinylidene diphosphonic acid), poly(2-phosphonomethyl acrylic acids), and the corresponding acrylates or acrylamides.

Among copolymers one can use copolymers containing two or more different types of repeating units bearing phosphonic- or phosphoric acid groups.

Examples are copolymers made from at least two of the following monomers: vinylphosphonic acid, allyl phosphonic acid, alkenylphosphonic acids such as isopropenylphosphonic acid, 1,1-vinylidene diphosphonic acid, styrenes bearing phosphonate or phosphate groups.

One could also use copolymers containing phosphonic or phosphoric acid groups as well as repeating units bearing other functional groups (to improve, for instance, processing or adhesion properties). Such groups could be phosphonic esters, carboxylic acids or esters, carboxylic amides, amines, sulfoxides, sulfones, sulphonic acids, ethers, thioethers, and alkyl- or perfluoroalkyl chains.

Examples are poly(vinylphosphonic acid-co-acrylic acid) and corresponding acrylates, poly(vinylphosphonic acid-co-methacrylic acid) and corresponding methacrylates, poly(vinyl alcohol) partially esterified with phosphoric acid.

Copolymers of phosphonic acids and esters of phosphonic acids can be obtained by partial hydrolysis of polymeric phosphonic esters, homopolymers as well as copolymers, or by direct copolymerization of phosphonic acids with phosphonic esters. The ester groups are chosen so as to give suitable electric- and process properties of the material, and can contain mono- as well as diesters. One example is poly(vinylphosphonic acid-co-(O-monoethyl vinylphosphonate)).

The functional interlayers can also consist of blends of the described polymers, whereby different polymeric phosphonic- or phosphoric acids are blended or where polymeric phosphonic- or phosphoric acids are blended with other oligomeric or polymeric materials. The latter may contain proton accepting groups such as polyvinyl alcohol, polyvinyl acetate, polyacrylic acid/polyacrylates, polyacrylamides or polyuretanes, polyesters, polyamides, polyethers, polyimines, polymethylvinylether-maleic acid, polyvinylpyrrolidone, polyacrylonitrile, cellulose or cellulose acetate. The phosphonate- or phosphate group containing polymers can also be mixed with electroactive polymers, like polythiophenes, e.g., PEDOT. Blends have been found to exhibit good electronic and processing properties when the concentration of phosphonic acid containing polymer is well above 50%. The size of the phase-separation domains can, however, be larger than the structures utilized in modern electronic devices. Examples of suitable blends include poly(vinylphosphonic acid)-blend-poly(acrylic acid) (PAA), with mixtures of PVPA and PAA in or near a 90:10 ratio being preferred. Further examples include Poly(vinylphosphonic acid)-blend-poly(methacrylic acid), Poly(vinylphosphonic acid)-blend-poly(maleic acid), Poly(vinylphosphonic acid)-blend-poly(styrenesulfonic acid), Poly(vinylphosphonic acid-co-acrylic acid)-blend-poly(acrylic acid), Poly(vinylphosphonic acid-co-acrylic acid)-blend-poly(methacrylic acid), Poly(vinylphosphonic acid-co-acrylic acid)-blend-poly(maleic acid), Poly(vinylphosphonic acid-co-acrylic acid)-blend-poly(styrenesulfonic acid).

The phosphonate or phosphate group containing polymers can be uses as the pure acids or in mixture with their corresponding salts with e.g., alkali, alkaline-earths, Zn, Al, Ti, Zr, Hf or with organic species such as alkyl/aryl substituted amines or polymeric amines like e.g., polyvinylpyridine, polyvinylazoles, substituted polyaminostyrenes, polyvinyl- or polyallylamines, polydiallylamines or polyethyleneimines.

Several of these materials have a high dielectric constant, in certain cases coupled with a high ohmic resistivity, in the kilohertz to megahertz frequency range. Being amorphous and homogeneous, these materials are structurally simpler than other well-known high dielectric constant organic materials that usually contain crystalline domains. This is important for successful preparation of well-defined ultra-thin films being morphologically and topologically homogeneous at the sub-micrometer level, cf. below.

Phosphonic acids form strong complexes with several metal ions. The stability of metal phosphonates, especially zirconium phosphonates is the base for a promising layer-by-layer (LBL) deposition technique that has emerged besides the more established techniques for self-assembly of mercaptanes on noble metal surfaces, or layer-by-layer deposition of oppositely charged polyelectrolytes. Relevant references on M-P chemistry: Zhang, Y., and Clearfield, A., Inorg. Chem. 31 2821 (1992), and: Cao, G., Lee, H., Lynch, V. M., Mallouk, T. E., Inorg. Chem., 27 2781 (1988)). Polymeric phosphonic acids mentioned in this patent have been successfully deposited by a spin-assisted zirconium-phosphonate LBL scheme to produce interlayers with acceptable properties.

Examples of spin-assisted Zr—P desposition is deposition and cross-linking of a polymeric phosphonic acid, followed by rinsing, exposure to a zirconyl chloride solution, and repeated rinsing. This cycle can be repeated to produce structurally well defined interlayers.

The polymers herein can be used to build up structures by layer-by-layer alternating, deposition of oppositely charged polyelectrolytes. (Cf., e.g.: G. Decher: "Layered Nanoarchitectures via Directed Assembly of Anionic and Cationic Molecules", in: *Comprehensive Supramolecular Chemistry, Vol. 9, "Templating, Self-Assembly and Self-Organization*, J.-P. Sauvage and M. W. Hosseini (eds.), Pergamon Press, Oxford, 1996, 507-528).

Examples are structures of alternating polymeric acids and polymeric bases where the polyacid is poly(vinyl phosphonic acid) or Poly(vinylphosphonic acid-co-acrylic acid) or Poly(vinylphosphonic acid-co-(O-monoalkyl vinylphosphonate)) and where the polymeric bases are Polyethylene-imines or Polyimideazoles. Another group of phosphonic or phosphoric based materials are the Ionenes. Examples are polymeric ammonium salts with low molecular weight phosphonic or phosphoric acids.

Small molecules bearing phosphonic- or phosphoric acid groups have a vapor pressure high enough to make deposition from vapor phase feasible. Alternating deposition of phosphonic acids and molecule able to form complexes with the same can also form interlayer functional in the devices described in this patent.

A representative example of an interlayer material according to the present invention is a co-polymer of vinylphosphonic acid (VPA) and acrylic acid (AA), co-polymer P(VPA-co-AA)(70:30). Such materials display low complex impedance, even under anhydrous conditions and at higher temperatures, e.g. at 80° C. It also exhibits high dielectric constants (300-500) in the frequency range 10 kHz to 100 kHz.

The electrodes and the materials thereof in the organic electronic device of the invention shall now be discussed in some detail. Several kinds of materials can be used for the electrodes that are in contact with the functional interlayers. However, one requirement is that possible reaction products must be avoided. Alternatively, materials and processing conditions may be chosen such that reaction products have low electrical impedance. Thus, reduction of electrical field strength in, e.g. memory cells, is kept low. Electrode materials of particular relevance are Au, Pt, Pd, Al or Ti. Another method of preventing high impedance regions to be formed is to introduce a barrier layer (eg. oxide or nitride) between the electrode and the functional interlayer. In that case also other electrode materials than the ones mentioned above are of relevance. Electrodes based on the titanium/titanium oxide combination, with the oxide facing the functional interlayer, have proven useful in conjunction with memory devices based on polymeric ferroelectrics as the electroactive material. Other examples of barrier layers of relevance are oxides and/or refractory metal nitrides, e.g., TiN and TaN"

The top electrode can be formed by different means. Care has to be taken not to damage the interface between the top electrode and the functional interlayer by irradiation, plasmas, heat etc from the deposition process itself. Typical deposition techniques include chemical vapor deposition (CVD), physical vapor deposition (PVD) or sputtering.

The manufacture of the electronic device of the invention requires suitable processes in depositing the interlayers. It also may be required to apply post-depositioned processes in order to improve the stability of the depositioned interlayers. Deposition of the functional interlayer material may be carried out by one of the following techniques: Spin coating, evaporation, sputtering, chemical vapour deposition (CVD), physical vapour deposition, self-assembly or alternating layer-by-layer (LBL) deposition of oppositely charged polyelectrolytes or LBL structures built by metal phosphonate chemistry.

Non-crystallinity is typically a prerequisite for formation of ultra-thin films that are morphologically homogenous at the sub-micron level, which in turn is a prerequisite for fabrication of finely patterned structures in practical devices. Most of the phosphate and phosphonate containing polymers described here are not selective with respect to tacticity, resulting in a negligible degree of crystallinity.

Acquiring uniform films through the spincoating process is a demanding task, which is advantageously carried-out in a controlled atmosphere, e.g. $N_2$ or other inert gasses. This renders high reproducibility and is over-all a very simple procedure. Alternatively, spin coating may be performed in an evacuated chamber.

The various layers can also be pre-treated before further depositions. Thus, either the bottom electrode (BE) or the top electrode (TE) can be treated with a peroxide in particular $H_2O_2$ prior to further deposition of film layers or electrodes. The morphology and topology of e.g., the produced PVPA- or the co-P(VPA-AA)films depends on the solution concentration, the spin rate and the topographical homogeneity of the actual base medium.

PVPA and its copolymers are soluble in water, and in mixtures of water and alcohols. In general, some water must always be present. A function of the alcohol is to increase wetting of the underlying hydrophobic film. Suitable solvents are e.g., mixtures of 1-propanol, (NPA), or 2-propanol, (IPA), or trifluoroethanol with water in ratios between 90:10 and 50:50, with 70:30 representing a preferred value.

A major problem related to the use of many interlayers based on polymeric phosphonic- or phosphoric is their solubility in water. This makes them incompatible with typical high volume manufacturing processes where wafers need to be washed with water in between processing steps or where several subsequent solution based deposition steps are carried out. This may damage or remove the functional interlayer. Thus, modifications need be done to stabilize the mentioned polymer layers and make them insoluble in water. This objective can be accomplished by e.g., cross-linking the polymers. Cross-linking also has the effect of increasing the cohesivity of the interlayer material.

For interlayers intended in this patent, cross-linking can be carried out by curing the interlayers thermally or by irradiation, whereby chemicals, so called cross-linking agents can be added to increase the degree of cross-linking.

The chemicals can be molecules carrying two or more functional groups forming covalent bonds to the polymers to be cross-linked. These are referred to as molecular cross-linkers here. It can also be ions forming complexes with at two or more groups present in the polymers, thus binding the polymers with ionic bonds.

On certain metal oxide substrates, simply heating a polymeric phosphoric- or phosphonic acid films can act to make the films insoluble, a process already practically utilized and published. The agent can also be an initiator that starts a polymerization reaction of groups present in the polymer, or monomers present that form an interpenetrating network acting to make the resulting composite insoluble. These chemical cross-linking methods typically require baking at an elevated temperature to effect cross-linking.

It is also possible to induce cross-linking by irradiating the polymer, with or without cross-linking agents mentioned above.

Below are given examples of preferred cross-linking methods and agents.

EXAMPLE 1

Thermal Curing

For some interlayer compositions, heat treatment is sufficient. This is especially the case on substrates as aluminium, for which this type of curing of poly(vinylphosphonic acid-co-acrylic acid) is well known.

For other polymeric interlayer compositions and other substrates, addition of cross-linking agents may be necessary. Molecules carrying two or more epoxide groups have been found useful to cross-link interlayer compositions, copolymers or blends, containing carboxylic acid groups in addition to phosphonic- or phosphoric acid groups. Such compositions with diepoxides have been found to become insoluble after a heat treatment.

Examples of such epoxides are (DGE), diglycidyl ethers of alkanes like butanediol diglycidyl ether, glycidyl endcapped ethers, such as poly- or oligo ethylene glycol or lower ethyleneglycols. Triglycidyl glycerol ether (TGG), triglycidyl isocyanurate TGIC), aromatic glycidyl ether like the diglycidyl cresoles (DGC) or diglycidyl ethers of e.g., the benzenedimethanols, N,N-diglycidylaniline, N,N-diglycidyl-4-glycidyloxyaniline, triglycidyloxybenzene glycidyl esters of polycarboxylic acids. Further, polymeric glycidyl ethers and esters can be used.

EXAMPLE 2

Ionic Cross-Linkers

An interlayer can be exposed to metal complexes, leading to formation of metal phosphonate complexes linking the polymer chains together.

Examples of metal complexes soluble in organic solvents that can be used to cross-link an interlayer based on polymeric phosphonic acids includes Zirconyl chloride, bromide and iodide, $ZrCl_4$, Titanyl acetylacetonate or Titaniumtetraalkoxides.

Amines, especially di- or polyfunctional can be added to an interlayer composition to form ions bonds cross-linking polymer chains. Examples include aliphatic- or aromatic di- or polyamines or polymeric amines.

EXAMPLE 3

Cross-Linking by Irradiation on Interlayer Compositions with Photoactive Additives 1. Thermal or UV-induced crosslinking of the polymers using e.g., AIBN or peroxides like cumene hydrogenperoxide, tert-butylperoxide or dibenzoylperoxide.
2. Molecules containing two or more azide groups can cross-link interlayer compositions upon UV irradiation.

EXAMPLE 4

Cross-Linking by Forming IPN

Thermal or UV-induced reactions using e.g., AIBN or a peroxide with diallylsulfone or divinylsulfone, or amines like diallylamine, or diallylamides like 1,3,-diallylurea or N,N-diallyltartardiamid or using divinylbenzen derivatives.

Certain preferred embodiments of cross-linking readout used in the present invention shall now be described. They include:

a): Thermal crosslinking with polyepoxides, like diepoxybutane, diepoxyhexane, diglycidyl ether (DGE), diglycidylalkyl ethers like e.g., diglycidyl 1,3-propanediol, glycidyl endcapped polyethylene oxide or the corresponding oligomers (DGPEO), triglycidyl glycerol (TGG), triglycidyl isocyanurate TGIC), aromatic glycidyl ether like the diglycidyl cresoles (DGC) or diglycidyl ethers of e.g., the benzenedimethanols, N,N-diglycidylaniline, N,N-diglycidyl-4-glycidyloxyaniline, triglycidyloxybenzene or glycidyl esters of polycarboxylic acids.

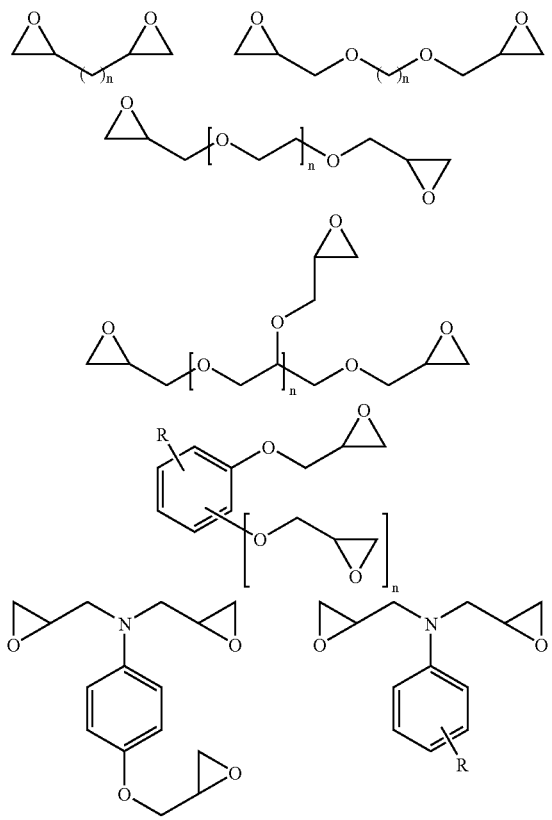

-continued

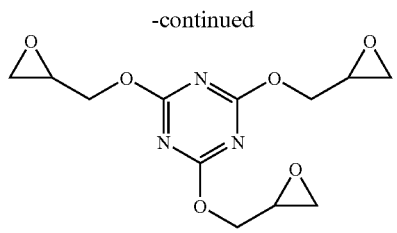

b): Thermally induced crosslinking with the polyisocyanates like the aromatic diisocyanatobenzenes, diisocyanatoxylenes, or aliphatic polyisocyanatoalkanes like 1,4-diisocyanatopropane or 1,6-diisocyanatohexane.

Isocyanates

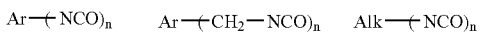

Ar. Aromatic or heteroaromatic ring
Alk: Alkyl group c): Thermal or UV-induced reactions using e.g., AIBN or a peroxide with diallylsulfone or divinylsulfone, or amines like diallylamine, or diallylamides like 1,3,-diallylurea or N,N-diallyltartardiamid or using divinylbenzen derivatives.

Allyl- and vinyl sulfones

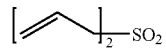 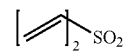

Allylamines and amides

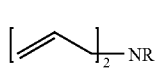 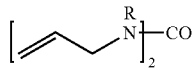

d): Thermal or UV-induced crosslinking using substituted polyazids, e.g., benzenedisulfonyl, benzenetrisulfonyl azides, benzenedimethylsulfonyl azides or benzenetrisulfonyl azides.

Sulfonyl azides

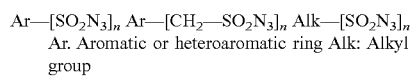

Ar. Aromatic or heteroaromatic ring Alk: Alkyl group e): Thermal or UV-induced crosslinking of the polymers using e.g., AIBN or peroxides like cumene hydrogenperoxide, tert-butylperoxide or dibenzoylperoxide.

The adhesion between certain polymeric acids used in interlayers described in this patent to adjoining materials can be poor enough to cause processing problems. Therefore, it is important to identify means for improving adhesion between the functional interlayer and the adjoining material, which may be, e.g., an electrode or a hydrophobic polymer. At the same time, the means for improving the adhesion should not impart poor electronic properties in the device. The adhesion between the interlayer and adjoining layers can be improved by chemically or physically modifying the substrate, so called priming.

Further, good adhesion can be imparted by suitable functional groups introduced as comonomers in a copolymer, as a polymer blend component, or as a surface active additive.

Below follows examples of preferred adhesion-improving processes and materials.

EXAMPLE 6

Priming

Priming a polymeric substrate or electrodes to improve adhesion to the interlayer could be treatment generating functional groups in the polymer substrate, e.g.: epoxy groups, peroxides, carboxylic acids, aldehyde, keto, amino hydroxyl groups.

Epoxy groups can f.ex. be generated by oxidation of double bonds present in the polymer substrate using peroxides or peroxy acids. Introduction of double bonds can be an initial part of the priming process.

Carboxylic acid, and other carbonyl and alcohol groups and peroxides can also be generated from the double bonds using ozone treatment. Hydroxyl groups can also be obtained from the double bonds.

The double bonds are often present in the substrate naturally, but they can also be introduced deliberately.

The epoxy groups can be used to bind the interlayer compositions in the same way as epoxide based crosslinkers are effective. Carboxylic groups, amides, esters, alcohols, amines and thiol groups can improve the adhesion to an interlayer by modifying the surface polarity, by forming dimers, anhydrides, amides and esters with carboxylic groups in the interlayer composition, or by utilizing metal-phosphonate chemistry, by forming complexes with polymer chains in the interlayer.

EXAMPLE 7

Copolymers

Compared to certain homopolymers exhibiting poor adhesion to hydrophobic or hydrophilic surfaces, such as poly(vinylphosphonic acid), copolymers prepared from vinylphosphonic acid and other monomers have better adhesion. Examples of copolymers with improved adhesion to hydrophobic surfaces, compared to the homopolymer poly(vinylphosphonic acid), are copolymers of vinylphosphonic acid and
vinylphosphonic esters,
acrylic acid,
methacrylic acid,
acrylic or methacrylic esters,
vinyl ether
Phosmers™

EXAMPLE 8

Blends

Examples of blends with improved adhesion to hydrophobic or hydrophilic surfaces, compared to the homopolymer poly(vinylphosphonic acid), are blends of poly(vinylphosphonic acid) and
Poly(acrylic acid)
Poly(methacrylic acid)
Poly(maleic acid)
Partially esterified poly(vinylphosphonic acid)

EXAMPLE 9

Adhesion Improving Additives

Adhesion improving additives can be molecules imparting good adhesion to adjoining hydrophobic layers that react so as to bind covalently and/or provide physical bonds with the polymers molecules in the interlayer composition.

Examples of such molecules are

Alkylglycidyl ethers

Fluoroalkyglycidyl ethers

Further examples are polyepoxide cross-linkers, mentioned in previous section, that have been shown to improve adhesion as well.

They can also be molecules simply acting as surfactants, for example Zonyl-F.

In certain cases, adhesion at the interfaces between polymeric electro-active organic materials and functional interlayers, e.g. PVPA, was significantly improved by subjecting the materials to thermal co-annealing.

A possible combination of good adhesion/good film morphology may be to utilize an alternative deposition to spincoating. An approach in this respect is to use metal-phosphonate (MP) chemistry. This allows the production of thinner films, which display improved morphology and less problems with surface tension compatibility than spin-coating. Zr—P chemistry has been established as a method to prepare robust layers beside LB films, alternating polyelectrolytes and SAM layers. The method for Zr modification of e.g. the preferred electrode embodiment combined with PVPA (TiO) and subsequent irreversible deposition of phosphonic acids is simple, allowing the deposition of PVPA monolayers on Ti/TiO. A process involving Zr treatment could be: $ZrOCl_2$ treatment (10 mM in MeOEtIMe) 10 min, wash, exposure to 0.3% PVPA solution, this leaves an insoluble PVPA layer on etched memory film.

Adhesion shall now be discussed for certain exemplary combinations of materials that are of specific interest due to their relevance in practical devices with reference to specific examples.

EXAMPLE 10

Adhesion between the bottom electrode (BE) and the phosphonic or phosphoric acid containing polymer, the Functional Interface Layer.

a) Ti/TiO-electrodes

The phosphonate and phosphate-polymers, in general exhibit good adhesion to Ti/TiO surfaces, as do their co-polymers or blends with polar polymers such as polyacrylates, polyacrylamides and similar compounds.

In order to modify the interface between the bottom electrode and the interlayer Ti/TiO electrode can be primed with auxilaries prior to application of the polymeric phosphonic- or phosphoric acid interlayer.

Such auxilaries could be vinylphosphonic acid, diols and polyols, epoxides with suitable functional groups or zirconium containing salts or complexes, such as zirconyl chloride or zirconium chloride.

b) Noble metal electrodes

Adhesion to, e.g., Au-electrodes can be achieved by pre-treatment with a mercaptoaryl- or alkylamines or amides, including cystein or cystein oligomers, mercaptoalkylglycols, or a alkyl/aryl mercapto phosphonic acid/ phosphoric acid. Here is also observed a SAM-effect. One example is 1,1'-biphenyl-4-mercapto-4'-phosphonate or the analogues with further extended polyaromatic or -heteroaromatic chains.

EXAMPLE 11

Adhesion between the phosphonic or phosphoric acid containing functional interface layer and the electro-active film.

Electro-active materials based on amide- or heteroaromatic polymers in general exhibit good adhesion to the phosphate/phosponate containing polymers, copolymers or blends described in the above.

Fluoro-containing electro-active layers exhibit satisfactory adhesion to functional interface layers containing polyacrylates or analogues, presumably due to favourable dipole-dipole interactions. Improved adhesion can otherwise be achieved by making the phosphate/phosphonate layer more "fluorophilic". Surface modification of the functional interlayer film can also be accomplished by reacting it with fluorinated alkyl epoxides or perfluoroalkyl glycidyl ethers. A fluorophilic surface can also be obtained by grafting onto the functional interlayer surface perfluroalkyl acrylates, or polyhexafluoropropylene oxide phosphates (Zonyl-fluoro surfactants) or perfluoroalkyl sulfonates or- carboxylates. The surface can also be modified by alkylation with perfluoroalkyl halides or by treatment with fluorinated ketones like e.g., hexafluoroacetone, hexafluoroacetylacetonate or octafluoro-2,4-hexadione.

EXAMPLE 12

Adhesion between the electro-active film and the phosphonic or phosphoric acid containing functional interface layer.

Poor adhesion between a substrate of an electro-active film and a phosphonic acid top-interlayer can make deposition by spin-coating difficult, especially for very thin top-interlayers. The electro-active film can be primed by treatment with a peroxide, e.g., $H_2O_2$ or m-chloroperbenzoic acid, before a top interlayer is deposited, or exposed to ozone. It has also been found that the electro-active film can spinning be treated with a poly(vinylphospnic acid-co-acrylic acid) followed by the reaction with a polyepoxy compound, or an epoxyalkyl- or arylphosphonate. Polyacrylates in general exhibit good adhesion to the electro-active film, so to the extend the top layer contains PAA or similar polymers, satisfactory adhesion is obtained. The use, perfluoroalkyl phosphonates or phosphates, e.g., Zonyl-fluoro surfactants, also improve adhesion.

EXAMPLE 13

Adhesion between the phosphonic or phosphoric acid containing functional interface layer and the top electrode.

a) Ti/TiO-electrodes

Good adhesion is in general obtained between Ti/TiO and phosphate/phosphonate containing polymers, also when as co-polymers or in blends with e.g., polyacrylates and similar polymers.

b) Noble metal electrodes

Adhesion in this case can be obtained if the film surface is first treated with compounds (oligomers and polymers) containing mercapto groups, such as alkyl- or arylmercapto phosphonates or- phosphates, sulfonates or carboxylates.

In order to improve or enhance the performance of the organic electronic devices of the invention, certain operations for this can be undertaken between or after the main steps in the manufacture of the device. Acid/base treatments have been shown to provide a modality for influencing the performance of devices incorporating films of materials according to the present invention. This principle must be applied with particular reference to each individual case. Thus, it has been shown that the presence of bases in the interlayer structure can be detrimental to device performance in at least two respects: First, bases can decrease the capacitance of the functional interlayer. Second, and more seriously, the presence of bases can induce buildup of dead layers after repeated exposure to electric fields during the running of the device, e.g. fields associated with polarization switching in a ferroelectric memory application.

An important example of acid/base treatments shall now be described. This is a process which shall henceforth be termed "acid reset", and which may be employed to repair damage wrought during photolithographic processing of devices incorporating functional interlayers according to the present invention: Practical devices that incorporate large number of cells such as the one shown in FIG. 3 that are connected to electronic circuitry elsewhere in the device typically require electrodes that are patterned. Depending on which patterning process is used for the top electrode set, this may alter or damage the functional interlayer underneath. The latter in many cases becomes exposed during the patterning process (several of the functional interlayer materials according to the present invention do not exhibit any significant ohmic conductivity, and may thus be applied globally between the electro-active material and the electrodes without creating electrical leakage problems between electrodes belonging to different cells). If top electrode patterning is performed by means of traditional wet etching procedures involving the use of bases, e.g. employing typical photo resist removers, this may seriously damage the functional interlayer. For concreteness, the acid reset process shall be illustrated with VPA containing polymers in the functional interlayers:

Base contamination of phosphonic acid/phosphoric acid group containing polymers is a reversible process. Thus, e.g., for PVPA films contaminated by amines, it has been established that they can be recovered by exposure to a removable over-layer consisting of a polymeric acid or a solution of a polymeric acid or low molecular weight acid, by employing an acid reset procedure, in which is preferentially used PVPA or stronger polymeric acids such as poly(styrenesulfonic acid), PSSH. The protonated bases migrate into the removable acid layer, while protons move in the opposite direction. After a certain period of time, the extraction layer is removed by washing. Repeating the procedure may be necessary.

Now various preferred embodiments of the organic electronic device of the invention shall be discussed with reference to manufacturing methods and materials as applied in conjunction therewith.

PREFERRED EMBODIMENTS

Figure 6:
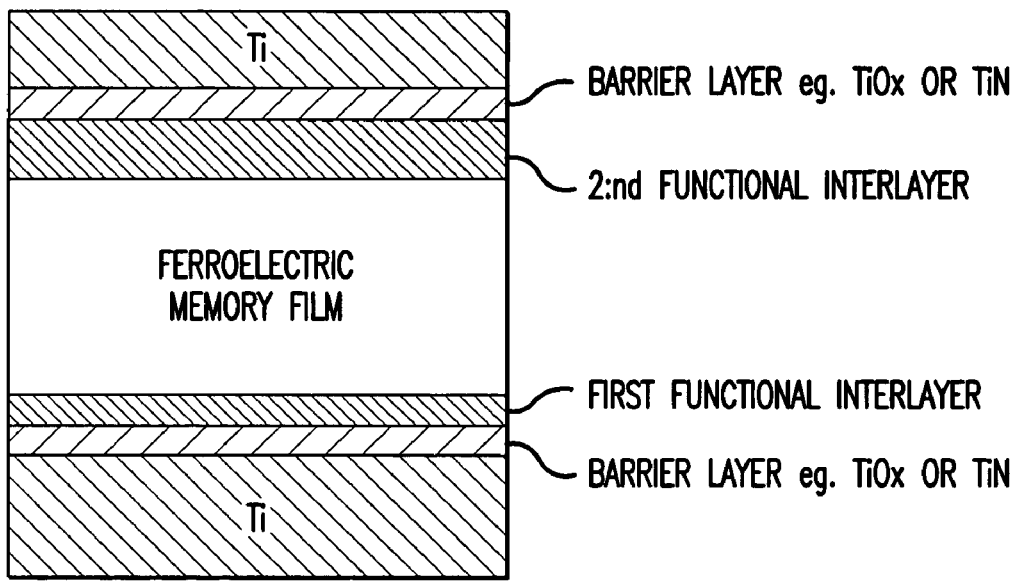
Figure 7A:
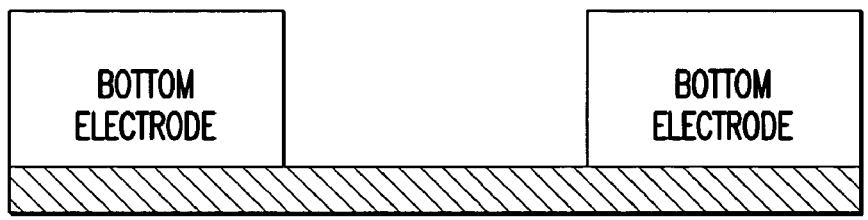
Figure 7B:
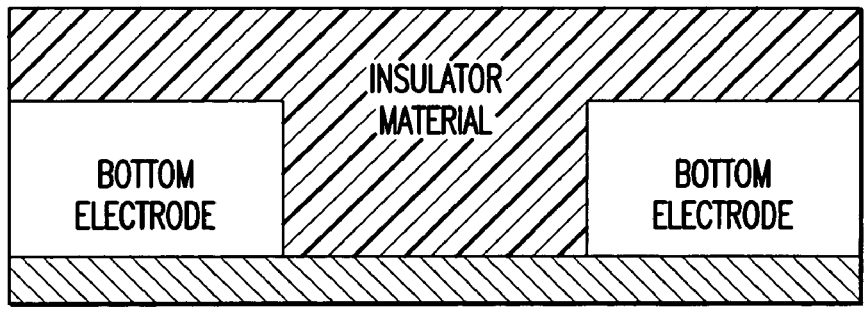
Figure 7C:
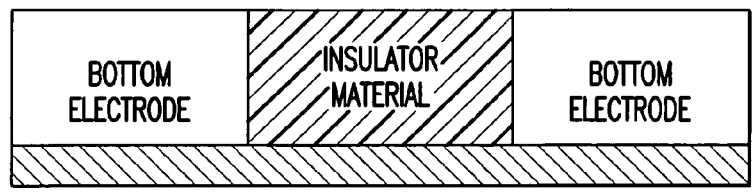
Figure 7D:
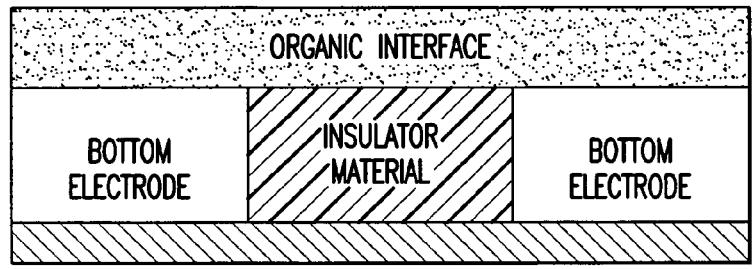
Figure 7E:
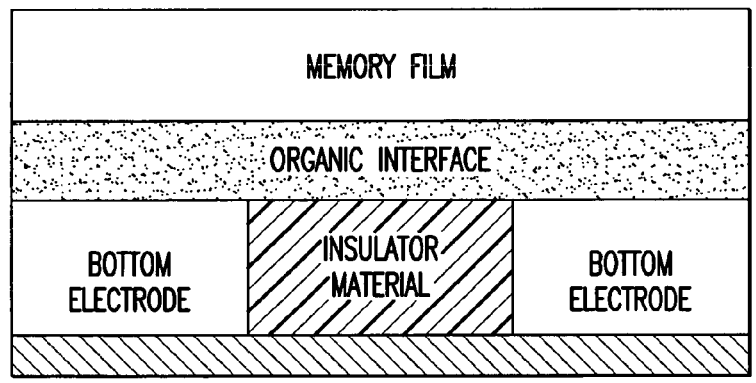
Figure 7F:
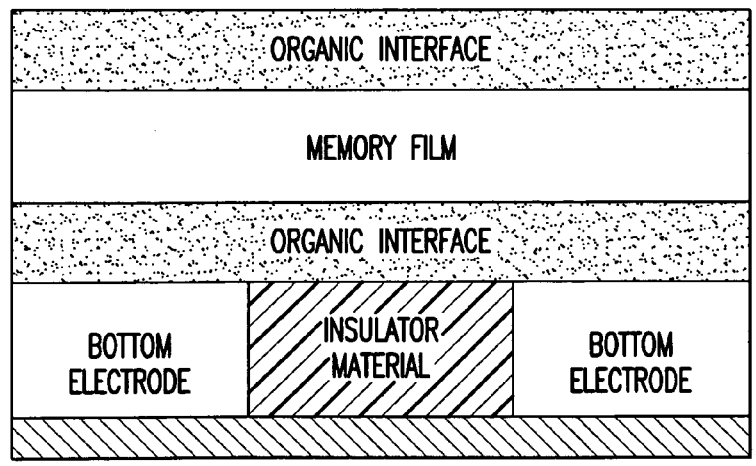
Figure 7G:
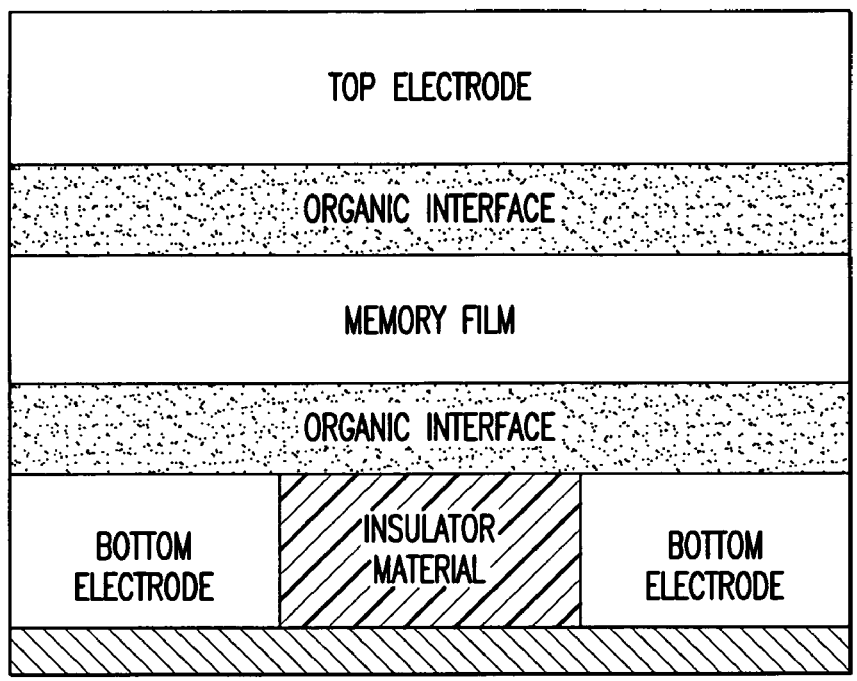
Figure 7H:
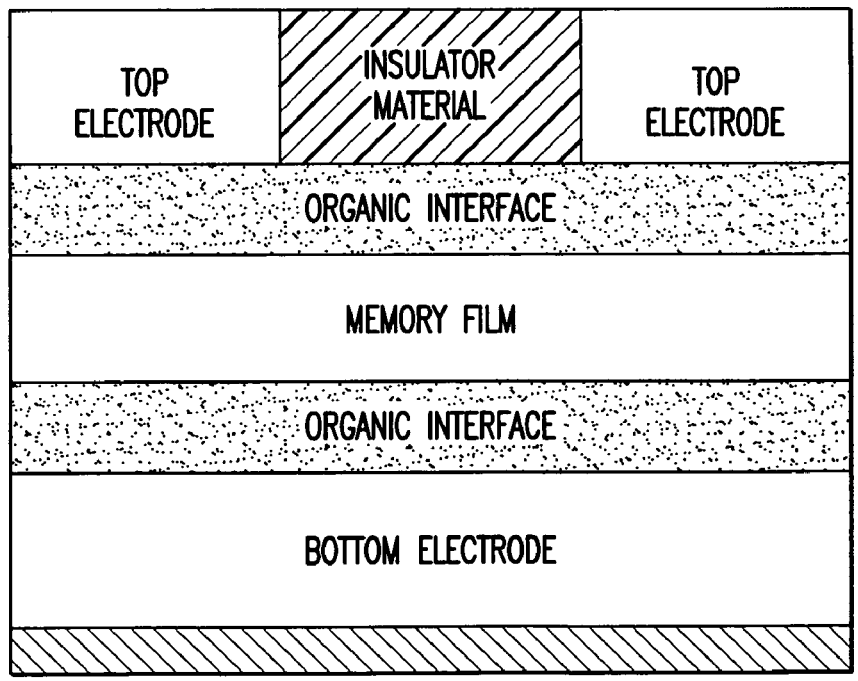

A preferred embodiment is illustrated in FIG. 6 which shows a cross section illustration of a non-volatile memory cell described in the present invention. The following is an example of a method for making such a memory cell. A bottom electrode is formed by chemical vapor deposition (CVD), physical vapor deposition (PVD) or sputtering and patterned with a mask and conventional etching techniques such as reactive ion etching or wet etching. In one embodiment the bottom electrode is a stack of aluminum and titanium which is covered with a barrier layer that prevents the formation of a high impedance interface between the metal and the functional interlayer. The thickness of the aluminum and titanium is dependent on the lithography and the speed and capacity requirements of the memory. In one embodiment the barrier layer is 50 Å-100 Å titanium oxide. After patterning of the bottom electrode the mask is removed by conventional resist stripping methods. A first functional interlayer is then globally deposited over the bottom electrode and the substrate. In one embodiment the functional interlayer is spin coated on from a solution of a polymeric phosphonic acid blended with a crosslinker in a mixture of alcohol and water. The concentration of copolymer in the solvent is preferably in the range 0.2-1% and the crosslinker to polymer ratio in the range 1:10-1:40 The spinning is carried out in a nitrogen environment at a rotational range of 1500 rpm to 4000 rpm for 30 s to 60 s. The first functional interlayer may be in the thickness range 50-500 Å. Following the deposition of the first layer there follows a bake to stabilize the layer.

The functional layer may be patterned or unpatterned depending on memory capacity and performance vs impedance properties of the functional interlayer. In one preferred embodiment the layer is left unpatterned.

Under similar spinning conditions a ferroelectric memory polymer is globally deposited on the functional interlayer. The memory layer may have a thickness from 200 to 2000 Å. The ferroelectric memory layer contains one or more polymers, copolymers or electret materials exhibiting electrical polarization remanence. A second functional interlayer (which need not be the same as the first) is then deposited onto the ferroelectric memory layer in a way similar to forming the first functional interlayer. In one preferred embodiment the deposition of the second functional interlayer is preceded by $H_2O_2$ treatment of the ferroelectric memory layer. The full stack is then annealed. The optimal annealing temperature is in the range from 100-160 C. The thickness of the 2:nd functional interlayer is in the range 50-500 Å. On top of the second functional interlayer a top electrode is deposited by PVD and patterned by a mask and conventional etching techniques. In one embodiment the top electrode consists of a barrier layer covered by one or more metal layers. The barrier layer may be 50-100 Å titanium oxide Various phosphonic acid containing polymers or polymer blends, and water based solvents may be used to form the functional interlayer. In one embodiment the polymer is a copolymer consisting of poly(vinylphosphonic acid co-acrylic acid) (P(VPA-AA)). The ratio between the VPA and AA is preferably in the range 50:50 to 90:10.In another embodiment the functional interlayers is based on a blend of PVPA and PAA in the range. 85:15 to 95:5. In one embodiment the crosslinker is Poly(ethylene glycol) diglycidyl ether (PEG-DGE). In another embodiment the crosslinker is 1,4-butanediol-diglycidyl ether Bu-DGE.

In another preferred embodiment, a passive matrix-addressed memory or display device contains cells of the general structure shown in FIG. 3 that are created at the crossings between two sets of parallel stripe electrodes, as illustrated in FIG. 7. In this preferred embodiment, the volumes between the bottom and/or top electrodes are filled by an insulating material before application of the functional interlayer. The insulating material is typically of low dielectric constant, which in certain cases shall have pronounced beneficial effect on the overall electrical characteristics of the passive matrix addressed device, e.g. by reducing the inter-electrode capacitance and electrical leakage. FIG. 7 shows basic steps in creating the structure: First (FIG. 7(1)), a set of bottom electrodes are laid down on the substrate, by standard lithography or other means, and the electrode surface is optionally subjected to treatments that shall enhance electrode performance in the finished device. There follows a deposition step (FIG. 7(2)) where the spaces between the electrodes are filled by an insulating, preferably low dielectric constant material. This may typically involve global deposition which also covers the electrodes. In the next step, the surface is polished by e.g. CMP, planarizing the surface and exposing the electrode material (FIG. 7(3)), or optionally leaving a thin film of the insulating material on the electrodes. A global layer of the functional interlayer material is then applied ("Organic interface" in FIG. 7(4)). The remaining part of the structure is made by global deposition of the electro-active material, e.g. a ferroelectric copolymer in the case of memory devices (cf. "Memory film" in FIG. 7(5)), and a top layer of functional interlayer material ("Organic interface" in FIG. 7(6)) which need not be identical to the functional interlayer material applied at the bottom electrode. The top electrode set is then applied by e.g. lithographic technique in conjunction with sputtering or evaporation of electrode metal, resulting in the structure shown in FIG. 7(7 and 8). In these steps, the functional interlayer material may contribute to protection of the underlying materials against damage from the lithography or electrode deposition processes. There then optionally follows a filling of spaces between the top electrodes by an insulating, typically low dielectric constant material, in analog fashion to the filling of spaces between the bottom electrodes. In cases where new structures are to be built on top of the thus created structure, the top surface may be polished to create a planar surface, suited for further lithography or coating steps in a stacked device.

Although the present invention has been described in terms of certain selected fields of applications, it shall be apparent to the skilled person that the materials and processes described above shall have potential applications in a number of additional instances, including:

i) as anti-static films on photographic paper and film, ii) as anti-static additives to insulating materials, iii) in high dielectric constant material in capacitors, iv) in organic light-emitting and display devices, v) in electrodes on electromechanical transducers and sensors, including loudspeakers, vi) in fuel cells, vii) in litography, viii) in electrochemical sensors, ix) in ion-analysis, x) in anti-static protection of electronic circuitry, xi) in batteries, xii) as dispersing agents and polymer surfactants, xiii) in materials for drug delivery devices and drug formulation, xiv) in materials for ion-extraction, e.g., uranium, xv) as antimicrobial coating, fabric-coating and as fire-proofing.

The invention claimed is:

1. An organic electronic device comprising electro-active organic materials provided in a capacitor-like structure and capable of responding physically or chemically when subjected to electric fields or currents, wherein the capacitor-like structure is a layered structure comprising first set and second set of respective electrodes contacting a layer of the electro-active organic materials on either side thereof, wherein at least one electro-active organic material in the capacitor-like structure forms a dielectric material of the capacitor-like structure, and can be accessed electrically directly or indirectly via the electrodes, wherein each capacitor-like structure can be addressed selectively for evoking an electro-active response, and further comprising at least one functional interlayer composed of one or more high-ε dielectric materials comprising molecular moieties linked to phosphonic or phosphoric acid groups or salts of the same, wherein one functional interlayer is provided between at least one of the electrodes and the interfacing electro-active organic materials, and wherein, in case more than one interlayer is provided, said interlayers can have similar or different compositions.

2. An organic electronic device according to claim 1, characterized in that the organic electronic device is a non-volatile memory device with said capacitor-like one or more memory cells in the form of said capacitor-like structure, wherein the electro-active material provided in said one or more memory cells, that the electro-active material is an electrically polarizable dielectric memory material with ferroelectric or electret properties and capable of exhibiting hysteresis or remanence, that memory cells in the non-volatile memory device form the elements of an active or passive matrix, such that the evoked electro-active response constitutes a write/read/erase operation establishing a desired polarization state in a memory cell or performing a polarization switching thereof, and that a definite polarization state established in the memory cell defines a logical state thereof.

3. An organic electronic device according to claim 1, characterized in that the organic electronic device is a light-emitting device, wherein the electro-active material is a light emitting material, such that the evoked electro-active response constitutes an emission of light when stimulated by an electric field or current.

4. An organic electronic device according to claim 1, characterized in that the molecular electronic device is a capacitor, wherein the functional interlayer itself constitutes the electro-active material.

5. An organic electronic device according to claim 1, characterized in that the electro-active organic materials consist of single molecules, oligomers, homopolymers, copolymers, or blends or compounds thereof.

6. An organic electronic device according to claim 1, characterized in that the functional interlayer materials consist of single molecules, oligomers, homopolymers, copolymers, or blends or compounds thereof.

7. An organic electronic device according to claim 1, characterized in that said molecular moieties include molecules of the form: RP, where R represents an organic molecule and P represents one or more phosphonic acid or phosphoric acid groups or salts of the same.

8. An organic electronic device according to claim 1, characterized in that said molecular moieties include polymers bearing phosphonic or phosphoric acid groups or salts of the same.

9. An organic electronic device according to claim 8, characterized in that said polymers are one or more of the following: polyvinyls, polyacrylates, polyacrylamids, polyethers, polyglycidyl ethersand/or esters, polyesters, polyetherketones, polyamides, polyurethanes, or polyureas.

10. An organic electronic device according to claim 8, characterized in that said phosphonic- or phosphoric acid groups or salts of the same are connected to a polymer backbone via amide, urethane, amine, ester, carbonate or ether groups.

11. An organic electronic device according to claim 1, characterized in that said molecular moieties include homopolymers with monomers bearing one or more phosphonic or phosphonic acid groups or salts of the same.

12. An organic electronic device according to claim 9, characterized in that said homopolymers are one or more of the following: poly[1-phosphonic acid-1 , 2-ethanediyl], more commonly known as poly(vinylphosphonic acid) or PVP A, or homopolymers of allyl phosphonic acid, alkenylphosphonic acids such as isopropenylphosphonic acid, 1,1vinylidene diphosphonic acid, or 2-phosphonomethyl acrylates.

13. An organic electronic device according to claim 11, characterized in that said monomers are of one or more of the following types: vinyl, vinylidene, alkenyl, acrylate or acrylic acids, acrylic esters, methacrylic acids, methacrylic esters, acrylic esters, acrylamides, vinyl ethers, glycidyl ethers and/or esters and styrenes.

14. An organic electronic device according to claim 11, characterized in that said monomers comprise one or more other functional groups for the purpose of improving adhesion and/or enabling cross-linking or otherwise facilitate processing.

15. An organic electronic device according to claim 1, characterized in that said molecular moieties include copolymers of two or more comonomers with at least one of the latter bearing phosphonic or phosphoric acid groups, or salts of the same.

16. An organic electronic device according to claim 15, characterized in that said comonomers are of one or more of the following types: vinyl, vinylidene, alkenyl, acrylate or acrylic acid, methacrylic acids, methacrylic esters, acrylic esters, acrylamides, vinyl ethers, glycidyl ethers and/or esters and styrenes.

17. An organic electronic device according to claim 15, purpose of improving adhesion and/or making the material composition insoluble or otherwise characterized in that one or more comonomers comprises one or more functional groups for the facilitate processing.

18. An organic electronic device according to claim 17, characterized in that said functional group is one or more of the following: carboxylic acid, carboxylic ester, mono- and diesters of phosphonic- or phosphoric acids, fluoroalkyl chains, or ethers.

19. An organic electronic device according to claim 15, characterized in that said copolymer is poly(vinylphosphonic acid-coacrylic acid) P(VP A-co-AA).

20. An organic electronic device according to claim 19, characterized in that the weight percentage of vinylphosphonic acid is between 50% and 100%.

21. An organic electronic device according to claim 15, characterized in that said molecular moieties include copolymers of phosphonic acid bearing monomers and and phosphonic ester bearing monomers, said ester being a monoester or a diester of the phosphonic acid.

22. An organic electronic device according to claim 21, characterized in that copolymers of phosphonic esters and phosphonic acids are formed by partial hydrolysis of a polymeric phosphonic acid.

23. An organic electronic device according to claim 1, characterized in that said molecular moieties are included in blends of polymers with one or more polymer bearing phosphonic or phosphoric acid groups and/or esters or salts of the same.

24. An organic electronic device according to claim 23, characterized in that at least one polymer bears one or more functional groups for the purpose of improving adhesion and/or making the material composition insoluble or otherwise facilitate processing.

25. An organic electronic device according to claim 24, characterized in that said functional groups are one or more of the following: a carboxylic acids, carboxylic esters, amides, mono- and diesters of phosphonic- or phosphoric acids, ethers, alcohols or phenols, mercaptanes or amines.

26. An organic electronic device according to claim 23, characterized in that one polymer is poly(vinylphosphonic acid) (PVP A), and another polymer is poly(maleic acid).

27. An organic electronic device according to claim 23, characterized in that one polymer is poly(vinylphosphonic acid) (PVP A), and another polymer is poly(methacrylic acid).

28. An organic electronic device according to claim 23, characterized in that one polymer is poly(vinylphosphonic acid) (PVP A), and another polymer is poly(acrylic acid) (P AA).

29. An organic electronic device according to claim 28, characterized in that the PVPA:PAA weight ratio is in the range 85:15 to 95:5.

30. An organic electronic device according to claim 1, characterized in that the salts comprise one or more of the following: Alkali metals, alkaline-earth metals, Zn, AI, Ti, Zr, substituted imidazoles and triazoles in general, ammonia, alkyl- or arylsubstituted amines in general, polyvinylpyridines, substituted polyaminostyres in general, substituted polyvinylamines, polyallylamines, polydiallylamines and polyethyleneimines in general.

31. An organic electronic device according to claim 1, characterized in that a top functional interlayer thickness is in the range of 50 Å-500 Å.

32. An organic electronic device according to claim 1, characterized in that a bottom functional interlayer thickness is less than 500 Å.

33. An organic electronic device according to claim 1, characterized in that at least one of the functional interlayers is resistant to degradation during electrode deposition.

34. An organic electronic device according to claim 1, characterized in that the material of the electrodes is chosen such that they react in a controlled manner with the functional interlayer to create an interface with high complex dielectric constant.

35. An organic electronic device according to claim 1, characterized in that the material in at least one of the electrodes is one or more of the following elements: Au, Pt, Pd, Ti, or Al.

36. An organic electronic device according to claim 1, characterized in that at least one of the electrodes is composed of Ti or Ti/TiOx.

37. An organic electronic device according to claim 1, characterized in that a protective layer is provided between the electrode and the functional interlayer.

38. An organic electronic device according to claim 37, characterized in that the protective layer is an oxide or a nitride.

39. An organic electronic device according to claim 1, characterized in that at least one of the functional interlayers is patterned.

40. An organic electronic device according to claim 1, characterized in that the organic electronic device comprises parallel stripe electrodes provided on a surface, and an insulating material is provided on the surface and flush with the electrodes in the spacings therebetween.

41. A method for manufacturing an organic electronic device comprising electro-active organic materials provided in a capacitor-like structure and capable of responding physically or chemically when subjected to electric fields or currents, wherein the capacitor-like structure is a layered structure comprising first set and second set of respective electrodes, contacting a layer of the electro-active organic materials on either side thereof, wherein at least one electro-active organic material in the capacitor-like structure forms a dielectric material of the capacitor-like structure, and can be accessed electrically directly or indirectly via the electrodes, wherein each capacitor-like structure can be addressed selectively for evoking an electro-active response, and further comprising at least one functional interlayer composed of one or more high-$\epsilon$ dielectric materials comprising molecular moieties linked to phosphonic or phosphoric acid groups or salts of the same, and wherein one functional interlayer is provided between at least one of the electrodes and the interfacing electro-active organic materials, characterized by depositing the functional interlayer material by one of the following processes: spin coating, evaporation, sputtering, chemical vapor deposition (CVD), physical vapour deposition, self-assembly or alternating layer-by-layer (LBL) deposition of oppositely charged polyelectrolytes, or LBL structures built by metal phosphonate chemistry.

42. A method according to claim 41, wherein the functional interlayer material is deposited by spin coating, characterized by the spin coating taking place in an evacuated chamber.

43. A method according to claim 41, wherein the functional interlayer material is deposited by spin coating, characterized by the spin coating taking place in an atmosphere consisting of one or more of the following gases or vapours: N2, inert gases, noble gases, or vapours of one or more spin coating materials and solvents.

44. A method according to claim 41, wherein the functional interlayer material is deposited by spin coating, characterized by using a heated spin coating solution.

45. A method according to claim 41, wherein the functional interlayer material is deposited by spin coating, characterized by using a solvent that is a mixture of water with one or more alcohols.

46. A method according to claim 45, characterized by the mixture being 1-propanol and/or 2-propanol and/or 2,2,2-trifluoroethanol with water, with an alcohol to water weight ratio selected in the range 50:50 to 90:10.

47. A method according to claim 41, wherein the functional interlayer material is deposited by spin coating, characterized by pretreating a deposition surface with peroxides such as $H_2O_2$ or alkyl- or aryl peroxides.

48. A method for manufacturing an organic electronic device comprising electro-active organic materials provided in a capacitor-like structure and capable of responding physically or chemically when subjected to electric fields or currents, wherein the capacitor-like structure is electro-active materials are provided in a layered structure comprising first set and second set of respective electrodes contacting a layer of the electro-active organic materials on either side thereof, wherein at least one electro-active organic material in the capacitor-like structure forms a dielectric material of the capacitor-like structure and can be accessed electrically directly or indirectly via the electrodes, wherein each capacitor-like structure can be addressed selectively for evoking an electro-active response, and further comprising at least one functional interlayer composed of one or more high-$\epsilon$ dielectric materials comprising molecular moieties linked to phosphonic or phosphoric acid groups or salts of the same, and wherein one functional interlayer is provided between at least one of the electrodes and the interfacing electroactive organic materials, characterized by stabilizing and/or insolubilizing at least one of the functional interlayer materials.

49. A method according to claim 48, characterized by including crosslinking molecules in the funcational interlayer material and inducing a crosslinking post-deposition reaction by heating or irradiation.

50. A method according to claim 48, characterized by using crosslinking agents to promote stability and/or decrease solubility of the functional interlayer.

51. A method according to claim 49, characterized by said crosslinking molecules having two or more epoxide groups.

52. A method according to claim 49, characterized by crosslinking using heat-induced reactions.

53. A method according to claim 49, characterized by crosslinking using UV-induced reactions.

54. A method for manufacturing an organic electronic device comprising electro-active organic materials capable of responding physically or chemically when subjected to electric fields or currents, wherein the electro-active materials are provided in a layered structure between a first set and a second set of respective electrodes, wherein a cell with a capacitor-like structure is defined in the electro-active materials and can be accessed electrically directly or indirectly via the electrodes, wherein each cell can be addressed selectively for evoking an electro-active response, and further comprising at least one functional interlayer composed of one or more high-$\epsilon$ dielectric materials comprising molecular moieties linked to phosphonic or phosphoric acid groups or salts of the same, and wherein one functional interlayer is provided between at least one of the electrodes and the interfacing electro-active organic materials, characterized by patterning at least one of the functional interlayers.

55. A method according to claim 54, characterized by performing the patterning using a hard mask.

56. An organic electronic device according to claim 1, characterized in that the functional interlayer materials further have high ohmic resistivity.

57. A method according to claim 41, wherein the functional interlayer materials further have high ohmic resistivity.

* * * * *